US008169349B2

(12) United States Patent
Huang et al.

(10) Patent No.: US 8,169,349 B2
(45) Date of Patent: May 1, 2012

(54) COMMUNICATION DEVICE AND NOISE CANCELLATION METHOD

(75) Inventors: Liang-Wei Huang, HsinChu (TW); Ting-Fa Yu, TouLiao (TW); Ta-Chin Tseng, TaiPei County (TW); Lie-Wei Fang, TaiChung County (TW)

(73) Assignee: Realtek Semiconductor Corp., HsinChu (TW)

( * ) Notice: Subject to any disclaimer, the term of this patent is extended or adjusted under 35 U.S.C. 154(b) by 6 days.

(21) Appl. No.: 12/879,892

(22) Filed: Sep. 10, 2010

(65) Prior Publication Data

US 2011/0063152 A1    Mar. 17, 2011

(30) Foreign Application Priority Data

Sep. 11, 2009 (TW) ................................ 98130820 A

(51) Int. Cl.
*H03M 1/00* (2006.01)
(52) U.S. Cl. .......................... 341/110; 341/118
(58) Field of Classification Search .................. 341/110, 341/118, 120, 155, 156; 370/289, 522, 535; 375/345; 381/1
See application file for complete search history.

(56) References Cited

U.S. PATENT DOCUMENTS

| 4,353,060 A * | 10/1982 | Endoh et al. ................. 341/110 |
| 7,002,897 B2 | 2/2006 | Jones et al. |
| 2008/0253489 A1 | 10/2008 | Huang |
| 2009/0225912 A1 | 9/2009 | Shih et al. |

* cited by examiner

*Primary Examiner* — Joseph Lauture
(74) *Attorney, Agent, or Firm* — Muncy, Geissler, Olds & Lowe, PLLC

(57) ABSTRACT

A communication device and the method thereof are disclosed in embodiments of the present invention. The communication device includes a level determining module, an digital to analog converter and an analog to digital converter. The level determining module determines a plurality of voltage levels and voltage intensity thereof according to an estimating signal to generate a first digital signal. The digital to analog converter converts the first digital signal into a pulse shaped analog signal according to the plurality of voltage levels and voltage intensity thereof. The analog to digital converter converts a first difference signal into a second digital signal wherein the first difference signal equals the result of subtracting the pulse shaped analog signal from a receiving signal.

15 Claims, 12 Drawing Sheets

COMMUNICATION DEVICE AND NOISE CANCELLATION METHOD

BACKGROUND OF THE INVENTION (a) Field of the Invention

The invention relates to a communication device, particularly to a communication device that is capable of eliminating echo and crosstalk.

(b) Description of the Related Art

FIG. 1 shows a schematic diagram illustrating a communication device in the prior art. The communication device 10 comprises a transmitting medium 11, a hybrid circuit 12, a local transmitting circuit Tx, and a local receiving circuit Rx. The communication device 10 can perform signal transmission and reception with a far-end communication device via the transmitting medium 11. Generally, the local transmitting circuit Tx comprises a digital to analog (DA) converter (not shown) for converting a signal into an analog signal to generate a transmission signal STX that is then outputted through the hybrid circuit 12 and the transmitting medium 11. The local receiving circuit Rx comprises an analog to digital (AD) converter for performing analog to digital conversion on the receiving signal SRX inputted via the hybrid circuit 12 and the transmitting medium 11.

Since signal transmission and reception of the communication device 10 usually occur at the same time, while the local receiving circuit Rx of the communication device 10 receives the signal SRX from the far-end communication device, the local receiving circuit Rx is interfered by the echo bounced back from the far-end communication device after the local transmitting circuit Tx of the communication device 10 transmits a signal and also interfered by near-end cross talk (NEXT) to result in lowering communication quality of the communication system.

Furthermore, the power of the signal SRX received by the local receiving circuit Rx of the communication device 10 is reduced due to transmission distance and the local receiving circuit 13 also simultaneously receives an echo signal, the power of which is much larger than the signal SRX. In order to completely receive and process the two signals, the dynamic range of the analog to digital (AD) converter of the local receiving circuit Rx should be designed to be large. Thus, the design of the communication device becomes complicate to result in increasing production cost.

BRIEF SUMMARY OF THE INVENTION

In light of the above-mentioned problems, one object of the invention is to provide a communication device to improve the complexity of the design of the analog to digital (AD) converter.

Another object of the invention is to provide a communication device to eliminate the difference between the input interference response and the output interference response of the analog to digital (AD) converter in the communication device.

One embodiment of the invention provides a communication device, comprising a level determining module, a digital to analog (DA) converter, and an analog to digital (AD) converter. The level determining module receives an estimating signal and determines a plurality of voltage levels and voltage intensity thereof according to the estimating signal to generate a first digital signal. The digital to analog (DA) converter receives the first digital signal and converts the first digital signal into a pulse-shaped analog signal according to the plurality of voltage levels and voltage intensity thereof. The analog to digital (AD) converter receives a first difference signal that is the result of subtracting the pulse-shaped analog signal from a receiving signal and converts the first difference signal into a second digital signal. The pulse duration of the pulse-shaped analog signal is shorter than one sampling period of the analog to digital (AD) converter.

One embodiment of the invention provides a communication device, comprising a level determining module, a digital to analog (DA) converter, an analog to digital (AD) converter, and a back end elimination module. The level determining module receives an estimating signal and determines a plurality of voltage levels and voltage intensity thereof according to the estimating signal to generate a first digital signal. The digital to analog (DA) converter receives the first digital signal and converts the first digital signal into a pulse-shaped analog signal according to the plurality of voltage levels and voltage intensity thereof. The analog to digital (AD) converter receives a first difference signal that is the result of subtracting the pulse-shaped analog signal from a receiving signal and converts the first difference signal into a second digital signal. The back end elimination module generates the estimating signal according to an output interference response of the analog to digital (AD) converter and the second digital signal, wherein the output interference response is the same as an input interference response.

One embodiment of the invention provides a noise cancellation method, comprising the following steps. At first, according to an estimating signal, a plurality of voltage levels and voltage intensity thereof are determined. According to the plurality of voltage levels and the estimating signal, a digital signal is generated. Then, according to the plurality of voltage levels and voltage intensity thereof, the digital signal is converted into a pulse-shaped analog signal. Following that, a first difference signal is converted into a second digital signal where the first difference signal is the result of subtracting the pulse-shaped analog signal from a receiving signal. Finally, according to an output interference response of the analog to digital (AD) converter and the second digital signal, the estimating signal is generated, wherein the output interference response is the same as an input interference response.

The communication device and method according to the embodiments of the invention utilize the digital to analog (DA) converter to generate a pulse-shaped analog signal to have the output interference response of the analog to digital (AD) converter be the same as the input interference response of the analog front-end circuit. Thus, the back end circuit can acquire the complete channel information of the original receiving signal in the digital domain so that the difference between the output interference response of the analog to digital (AD) converter and the input interference response of the analog front-end circuit can be eliminated and thus the echo and crosstalk components can be correctly eliminated. Concurrently, the purpose of reducing the dynamic range of the analog to digital (AD) converter as well as improving the design complexity can be achieved.

DETAILED DESCRIPTION OF THE INVENTION

The communication device according to the embodiments of the invention will be described in details with reference to the drawings.

Figure 1:
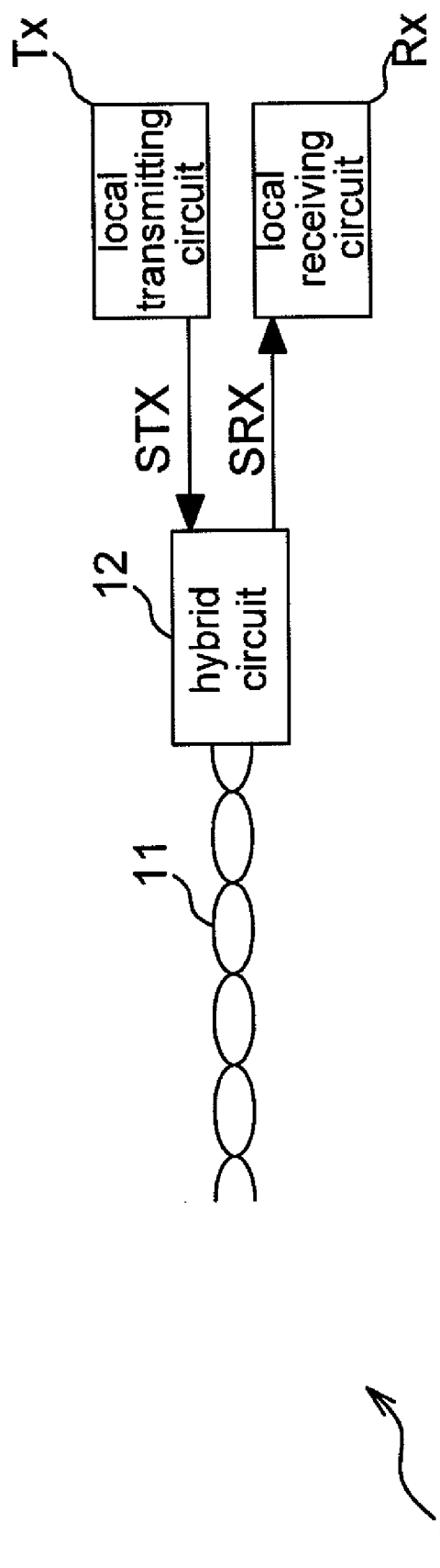
FIG. 1 shows a schematic diagram illustrating a communication device according to the prior art.
Figure 2:
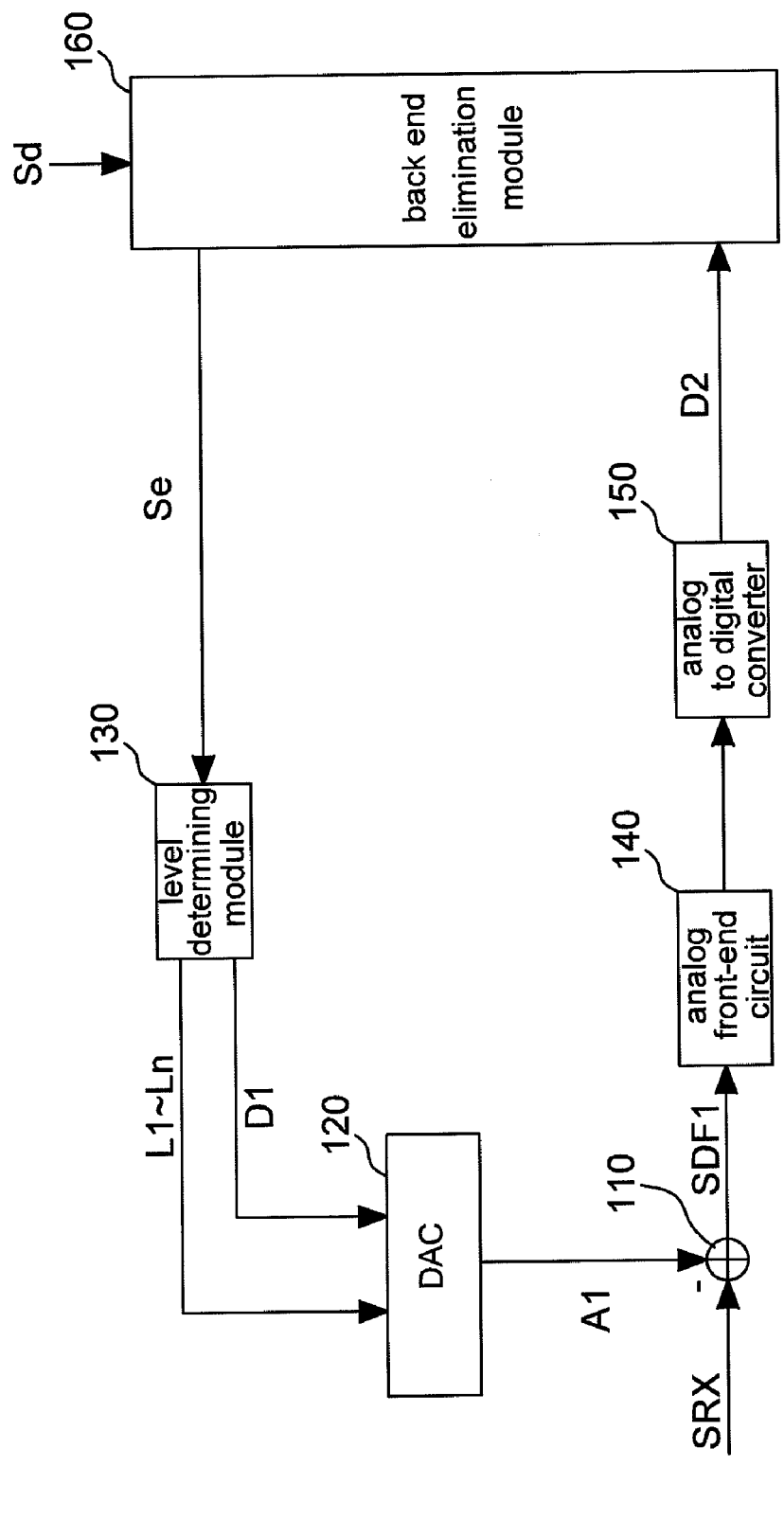
FIG. 2 shows a schematic diagram illustrating a communication device according to one embodiment of the invention.

FIG. 2 shows a schematic diagram illustrating a communication device according to one embodiment of the invention. The communication device 100 is applicable to the receiving circuit Rx shown in FIG. 1. The communication device 100 comprises a calculator 110, an digital to analog converter (DAC) 120, a level determining module 130, an analog front-end circuit 140, an analog to digital converter (ADC) 150, and a back end elimination module 160.

The communication device 100 receives a receiving signal SRX. In one embodiment, the receiving signal SRX can comprise a signal transmitted from a far-end communication device and the noise components like echo and crosstalk (NEXT) mixing with the signal.

The calculator 110 is used to subtract a pulse-shaped analog signal A1 from the receiving signal SRX to generate a first difference signal SDF1. In one embodiment, the calculator 110 is a subtracter.

The analog front-end circuit 140 is used to process the first difference signal SDF1 outputted by the calculator 110. In one embodiment, the analog front-end circuit 140 is used to perform either a signal scaling up or down process or a filtering process on the first difference signal SDF1 or perform the combination of the two processes.

The digital to analog converter (DAC) 120 couples to the calculator 110 and receives a first digital signal D1. According to the voltage levels L1~Ln and the corresponding voltage intensity of the voltage levels L1~Ln, the digital to analog converter (DAC) 120 converts the first digital signal D1 into a pulse-shaped analog signal A1.

The level determining module 130 couples to the digital to analog converter (DAC) 120 and is to receive an estimating signal Se and determine the voltage levels L1~Ln and the corresponding voltage intensity of the voltage levels L1~Ln according to the estimating signal Se to generate the first digital signal D1. In the above, the number "n" can be an odd number such as 3, 5, 7, 11, 13, 15, etc.; or n can be a power of two, such as 2, 4, 8, 16 . . . .

The analog to digital converter (ADC) 150 couples to the analog front-end circuit 140 and is to receive the first difference signal SDF1 generated from the result of subtracting the pulse-shaped analog signal A1 from the receiving signal SRX and convert the first difference signal SDF1 into a second digital signal D2.

The back end elimination module 160 is to estimate and eliminate the echo and crosstalk noise components in the receiving signal SRX. According to a desired signal Sd and the second digital signal D2, the back end elimination module 160 generates the above estimating signal Se. In one embodiment, the estimating signal Se is the estimated value of the echo and crosstalk noise components.

Referring to FIG. 2, FIGS. 3A~3C, and FIG. 4, the following will describe the operating method and principle of the communication device 100 according to the embodiment of the invention.

During operation, the communication device 100 receives the receiving signal SRX. According to the estimating signal Se, the level determining module 130 determines the number of the voltage levels L1~Ln and the corresponding voltage intensity to generate the first digital signal D1.

Then, according to the voltage levels L1~Ln and the corresponding voltage intensity, the digital to analog converter (DAC) 120 converts the first digital signal D1 into a pulse-shaped analog signal A1. The analog front-end circuit 140 receives the first difference signal SDF1 that is the result of subtracting the pulse-shaped analog signal A1 from the receiving signal SRX and transmits to the analog to digital converter (ADC) 150 after performing the signal scaling up/down or filtering process. Since the echo and crosstalk noise components estimated by the estimating signal Se is subtracted from the receiving signal SRX, the amplitude range of the receiving signal SRX is reduced to be within the acceptable dynamic range of the analog to digital converter (ADC) 150. Therefore, when the receiving signal SRX passes the analog to digital converter (ADC) 150, the analog to digital converter (ADC) 150 can normally process the receiving signal SRX so that the signal will not be cut off due to exceeding the dynamic range of the analog to digital converter (ADC) 150.

The back end elimination module 160 receives the second digital signal D2 generated by the analog to digital converter (ADC) 150 and estimates the output interference response (i.e. echo and crosstalk existing in the receiving signal SRX in the current channel) of the analog to digital converter (ADC) 150 according to the second digital signal D2 to generate a new estimating signal Se. Following that, according to the new estimating signal Se, the level determining module 130 determines the voltage levels L1~Ln and the corresponding voltage intensity to generate a new first digital signal D1. Again, according to the new first digital signal D1, the digital to analog converter (DAC) 120 generates a pulse-shaped analog signal A1. After the analog front-end circuit 140 processes the difference signal SDF1 that is the result of subtracting the analog signal A1 from the receiving signal SRX, the analog to digital converter (ADC) 150 generates a new digital signal D2 according to the difference signal SDF1.

By the above mentioned method, the communication device 100 according to the embodiment of the invention sets the voltage levels of a signal according to the state of the receiving signal SRX in the channel and thereby appropriately eliminates the echo and crosstalk components in the receiving signal SRX so as to solve the problem in the prior art. In addition, the amplitude of the receiving signal SRX can be appropriately reduced so that the dynamic range of the analog to digital converter (ADC) 150 for signal processing can be reduced. Thus, the design complexity and production cost can be decreased.

It should be noted that, during the operation of the communication device 100 according to the embodiment of the invention, N most significant bits (MSB) of the output interference response (including the echo and crosstalk components) of the analog to digital converter (ADC) 150 are processed by the back end elimination module 160 and the level determining module 130. The digital to analog converter (DAC) 120 converts N most significant bits of the noise from the digital signal D1 into the pulse-shaped analog signal A1. Therefore, the N most significant bits of the noise component can be eliminated during analog processing before the analog to digital converter (ADC) 150. The rest of the noise component in the output interference response (including the echo and crosstalk components) of the analog to digital converter (ADC) 150 can be eliminated during digital processing after the analog to digital converter (ADC) 150. For example, the rest of the noise component can be eliminated in the back end elimination module 160.

Figure 3A:
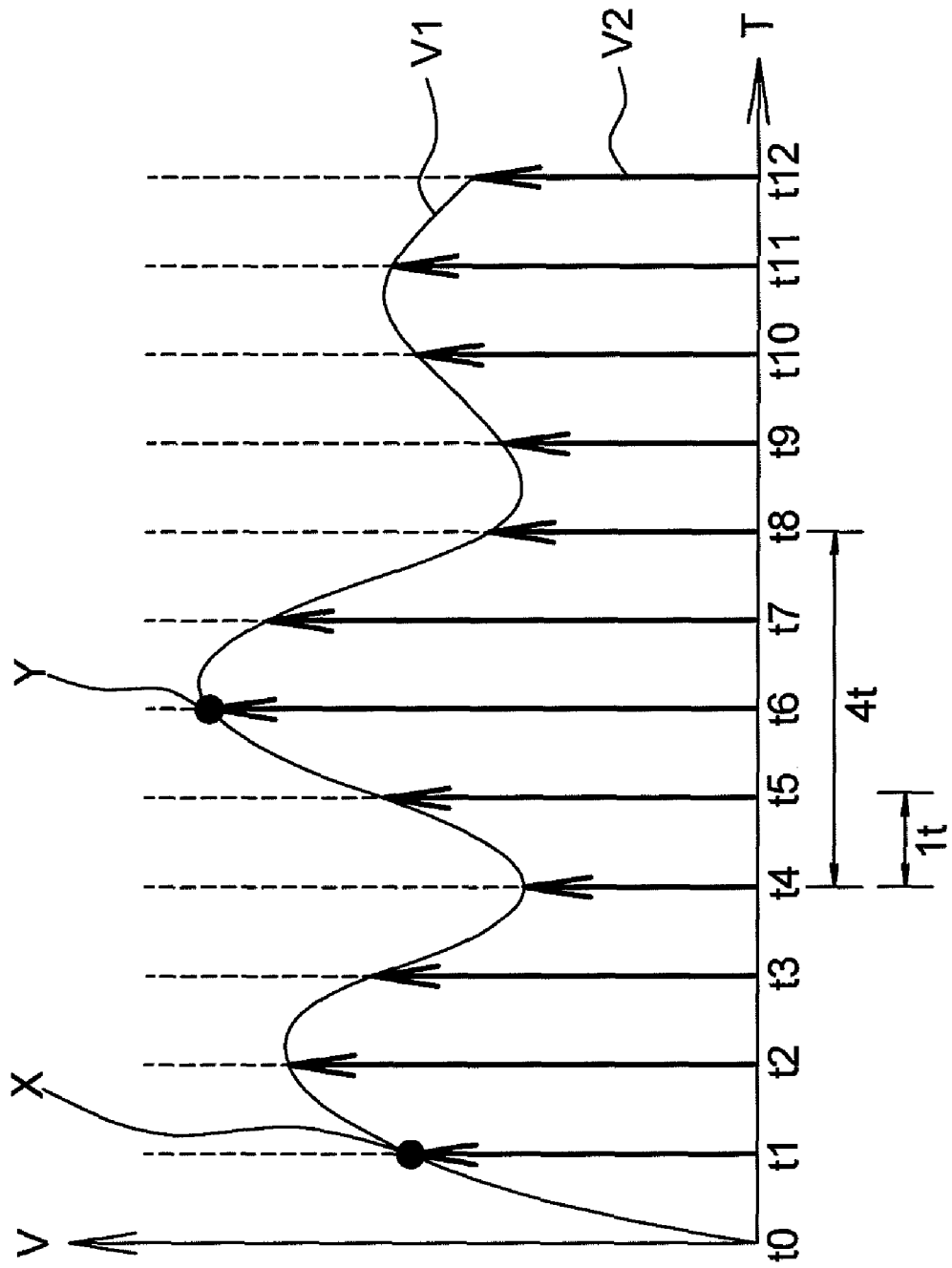
FIG. 3A shows an operating waveform diagram of the communication device according to one embodiment of the invention.
Figure 3B:
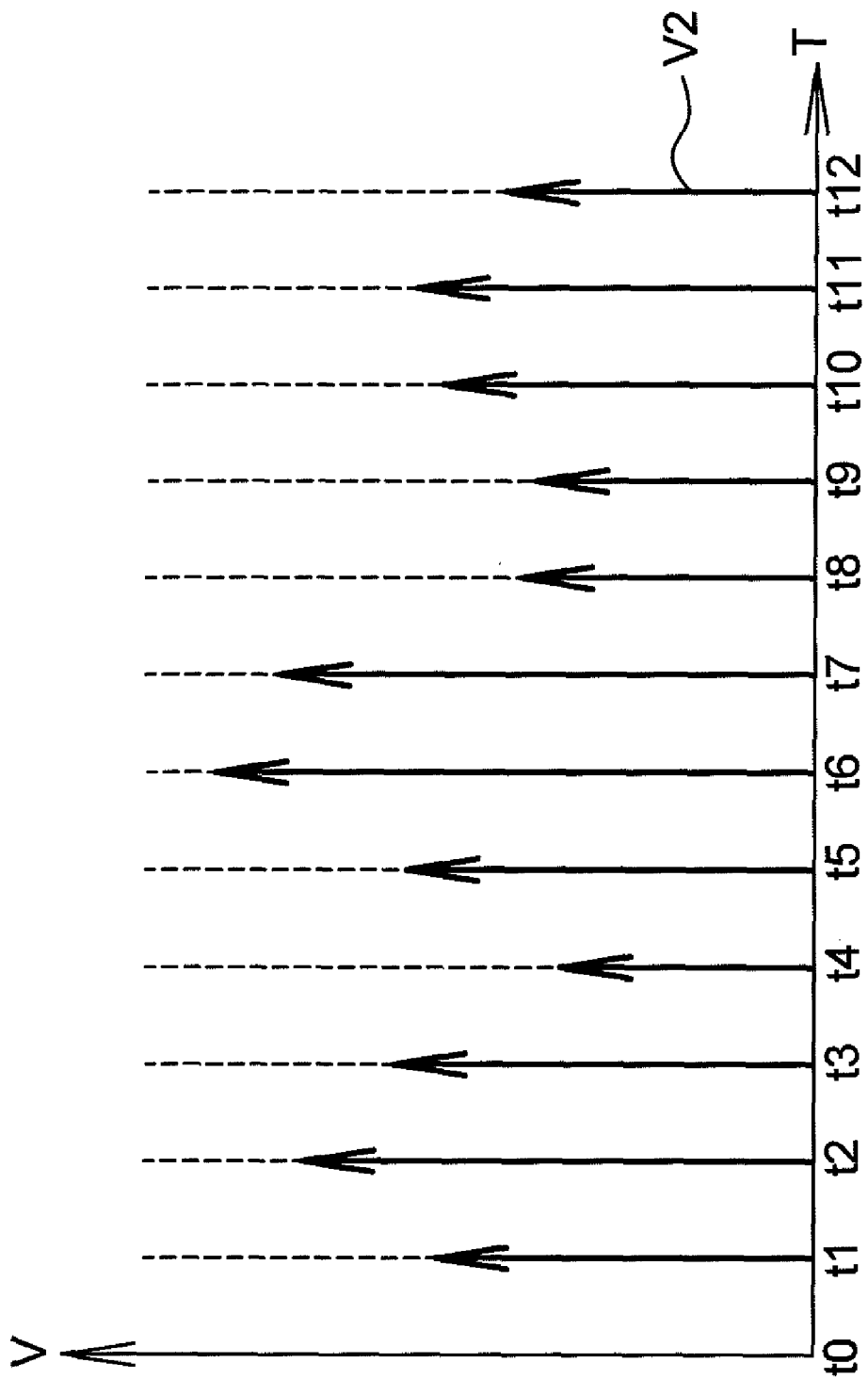
FIG. 3B shows an operating waveform diagram of the communication device according to one embodiment of the invention.
Figure 3C:
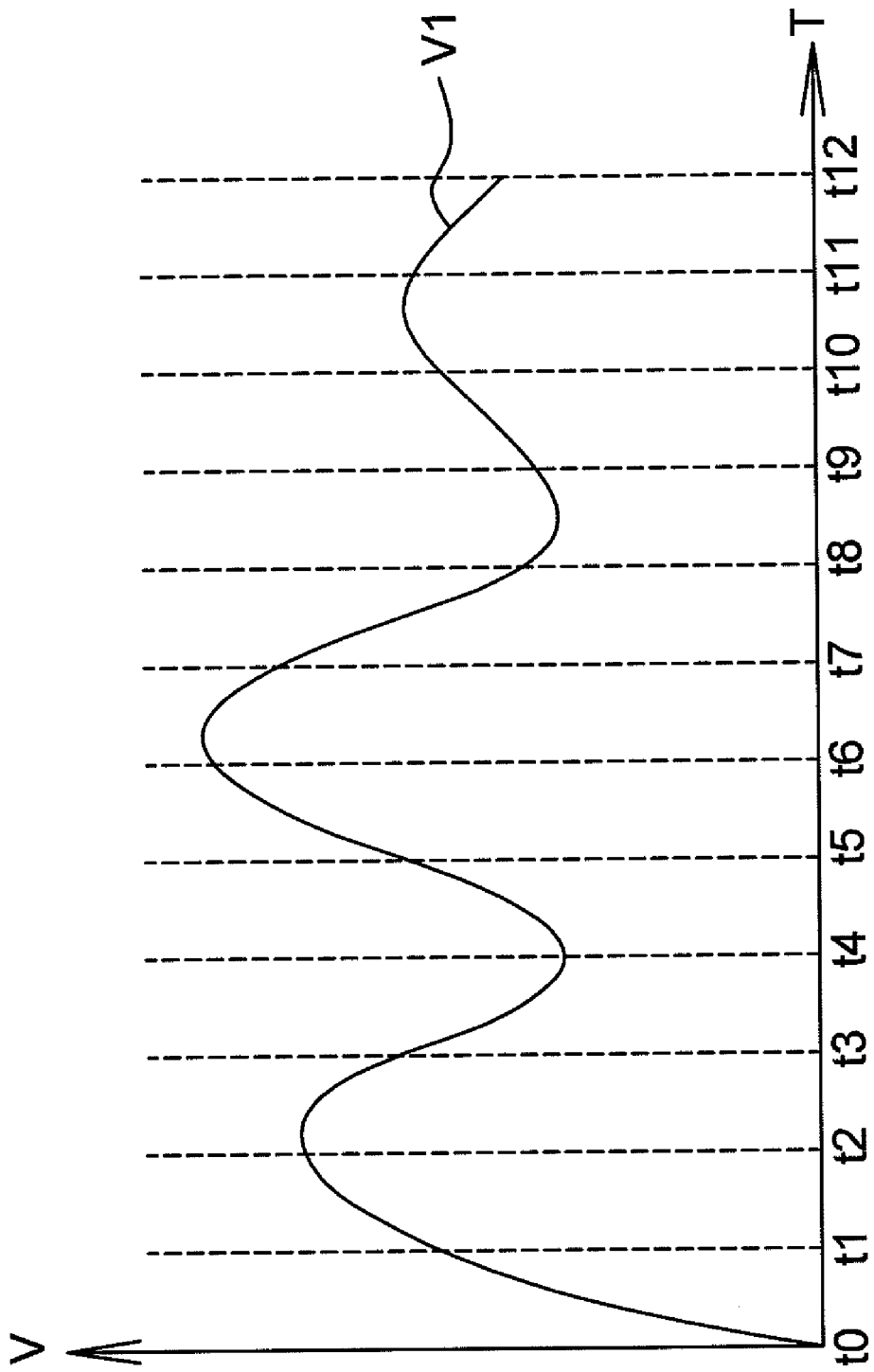
FIG. 3C shows an operating waveform diagram of the communication device according to one embodiment of the invention.

As shown in FIGS. 3A-3C, the figures show the waveform diagrams of the related signals while the communication device 100 is in operation. The horizontal axis represents time T while the vertical axis represents voltage V. V1 is the waveform of the receiving signal SRX while V2 is the waveform of the pulse-shaped analog signal (most significant bits of the noise) A1. In one embodiment, the pulse-shaped analog signal A1 can be a return-zero pulse shaped signal.

Generally, the input interference response of the analog front-end circuit 140 is different from the output interference response of the analog to digital converter (ADC) 150. But, the communication device 100 according to the embodiment of the invention uses the digital to analog converter (DAC) 120 to output a pulse-shaped waveform and thereby in the digital domain the communication device 100 can sample the input interference response of the analog front-end circuit 140 that is the same as the output interference response of the analog to digital converter (ADC) 150.

The principle of how the communication device 100 samples the input interference response of the analog front-end circuit 140 that is the same as the output interference response of the analog to digital converter (ADC) 150 in the digital domain will be described in the following.

As the digital to analog converter (DAC) 120 outputs the pulse-shaped waveform V2 (shown in FIG. 3B), the signal format that can be sampled by a digital process is the format in Z-domain (for example, a superset of the frequency domain). In addition, during the digital process, the pulse-shaped waveform can be converted into the format in Z-domain. Thus, the pulse-shaped waveform can be processed by digital circuits.

Besides, during signal sampling, it is only required that for the sampled signal the output interference response of the analog to digital converter (ADC) 150 is the same as the input interference response of the analog front-end circuit 140. But it is not required that the output interference response of the analog to digital converter (ADC) 150 is the same as the input interference response of the analog front-end circuit 140 at each time point. Thus, the pulse outputted by the digital to analog converter (DAC) 120 after the response conversion of the analog front-end circuit 140 such as convolution will not affect the next sample time of the analog to digital converter (ADC) 150. By this method, the back end circuit (such as back end elimination module 160) can use the pulse-shaped signal V2 to recover the signal waveform V1 of the receiving signal SRX in the channel, as shown in FIG. 3C. Thus, the back end circuit can acquire the complete channel information of the original receiving signal SRX in the digital domain and then the back end elimination module 160 can correctly estimate echo and crosstalk in the channel to generate a correct estimating signal Se for eliminating the echo and crosstalk components. In addition, the purpose of reducing the dynamic range of the analog to digital converter (ADC) 150 as well as improving its complexity can also be achieved.

The conditional sampling equation of the analog to digital converter (ADC) 150 is as follows:

$$G(Pu, AFE) < T \quad (1)$$

where G represents convolution, Pu represents the pulse of the pulse-shaped analog signal A1 of the digital to analog converter (DAC) 120, AFE represents the input interference response before the analog to digital converter (ADC) 150, and 1T represents one time sampling duration of the analog to digital converter (ADC) 150.

Figure 4:
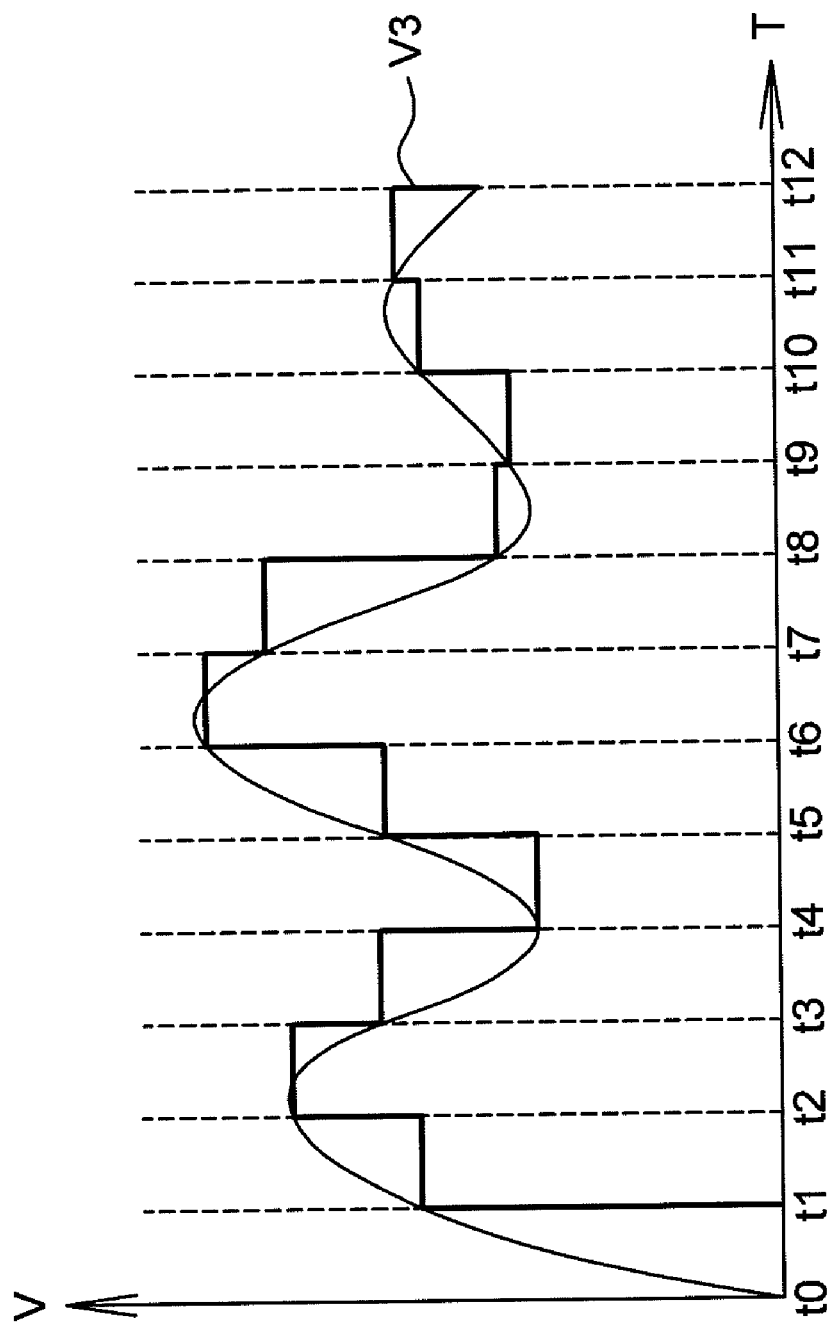
FIG. 4 shows an operating waveform diagram of the communication device according to the prior art.

Since the signal generated by the digital to analog converter (DAC) in the prior art is of zero-order hold, as shown by the waveform V3 in FIG. 4, the signal cannot be sampled in the digital domain. Thus, the communication device in the prior art cannot recover the most significant bit noise that was cut in the front end circuits. Therefore, the back end circuit 160 can not have the complete channel information of the receiving signal SRX so that the back end circuit 160 can not estimate a correct estimating signal Se.

Moreover, the pulse length of the pulse-shaped analog signal A1 generated by the communication device 100 according to the embodiment of the invention should have enough length to cooperate with the sampling clock so that the analog to digital converter (ADC) 150 can seize the highest position of the pulse (that is the un-deformed point), for example, the points X, Y shown in FIG. 3A. On the other hand, the time of the pulse length cannot be too long and thus the above conditional sampling equation (1) should be satisfied. Therefore, the sampled pulse is sufficient as a reference for the back end circuit to correctly recover the waveform of the receiving signal SRX. For example, as shown in FIG. 3A, the pulse duration of the pulse-shaped analog signal A1 is 1t that is shorter than the sampling period 4t of the analog to digital converter (ADC) 150.

In one embodiment, the digital to analog converter (DAC) 120 increases its signal output speed so that the outputted signal becomes pulse-shaped. In another embodiment, the digital to analog converter (DAC) 120 is ON at the time t1, OFF from the time t1 to the time t2, ON until the time t2, OFF from the time t2 to the time t3, and ON until the time t3. By repeating this method, the pulse-shaped analog signal A1 can be generated.

The method for controlling the digital to analog converter (DAC) 120 can be implemented by the circuits in the digital to analog converter (DAC) 120 utilizing software, firmware, or hardware. In another embodiment, external signals inputted through pins are used to control ON or OFF. In another embodiment, the digital to analog converter (DAC) 120 can have an external control unit (not shown) to control the act of ON or OFF of the output signal of the digital to analog converter (DAC) 120. Besides, any current or future developed control method or control circuit can be used to control the digital to analog converter (DAC) 120 of the invention.

In addition, while the communication device is turned on or after the communication device executes for a predetermined period of time or a desired period of time set by a designer, according to the above conditional sampling equation (1), the pulse of the digital to analog converter (DAC) 120 and the sampling clock of the analog to digital converter (ADC) 150 are to be calibrated; and/or according to the principle of whether or not the highest point (un-deformed point) of the pulse of the digital to analog converter (DAC) 120 is sampled, the pulse of the digital to analog converter (DAC) 120 and the sampling clock of the analog to digital converter (ADC) 150 are to be calibrated.

The digital to analog converter (DAC) of the communication device according to the embodiment of the invention can be a current DAC or a line DAC. Obviously, the digital to analog converter (DAC) of the communication device according to the embodiment of the invention can be any current or future developed digital to analog converter.

Figure 5:
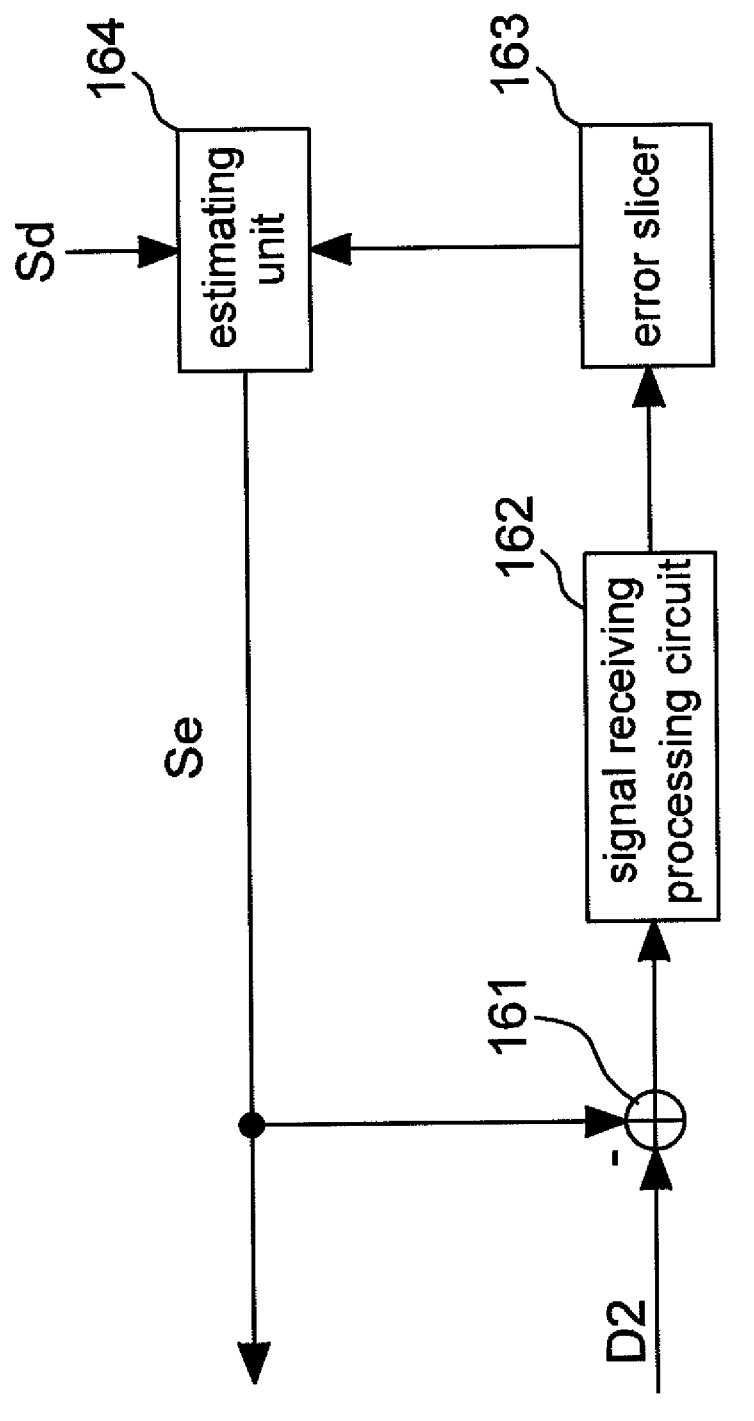
FIG. 5 shows a schematic diagram illustrating a back end elimination module of the communication device according to one embodiment of the invention.

The back end elimination module 160 of the invention can be implemented by any current or future developed echo and/or crosstalk elimination module. In one embodiment, as shown in FIG. 5, the back end elimination module 160 comprises a calculator 161, a signal receiving processing circuit 162, an error slicer 163, and an estimating unit 164. The calculator 161 can be a subtracter and the signal receiving processing circuit 162 can be an equalizer. If the communication device 100 is applied in the local receiving circuit Rx shown in FIG. 1, the desired signal Sd can be provided by the local transmitting circuit Tx shown in FIG. 1. It should be noted that those who are skilled in the art should understand the operating method of the back end elimination module 160 from the figure. Thus, its details will not be given hereinafter.

Figure 6:
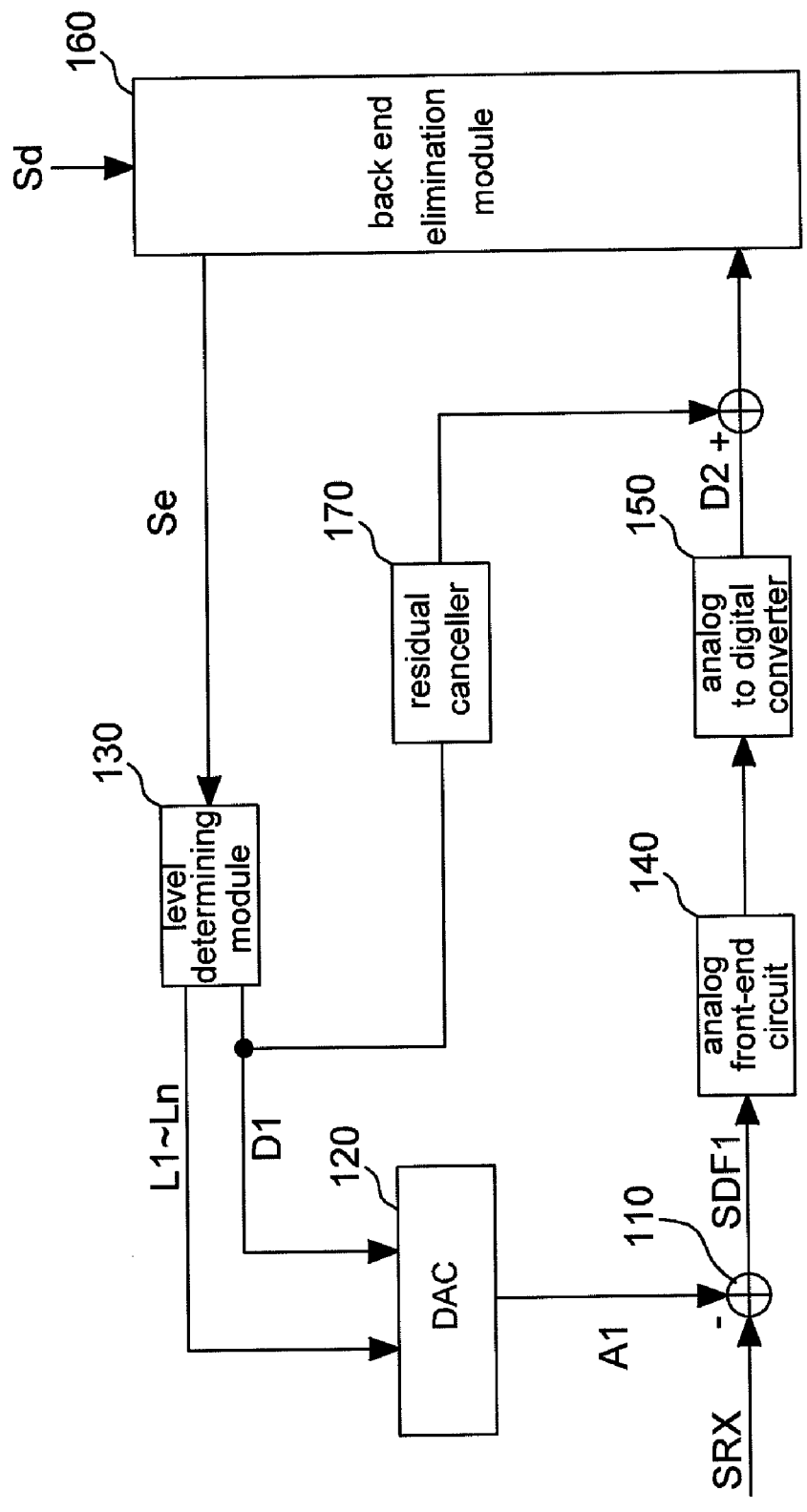
FIG. 6 shows a schematic diagram illustrating a communication device according to another embodiment of the invention.

Since the output interference response of the N most significant bits (MSB) is the same as the output interference response of the rest of the noise component, in one embodiment it may not need a residual canceller. But if the clock of the analog to digital converter (ADC) 150 cannot sample the highest point (un-deformed point) of the pulse or the conditional sampling equation (1) cannot be satisfied, a residual canceller 170 can be added between the calculator 110 and the back end elimination module 160 to simulate the signal response between the calculator 110 and the back end elimination module 160 to compensate the subtracted signal A1 in the analog process, as shown in FIG. 6. The residual canceller 170 can be an adaptive filter that is applicable to an adaptive algorithm. The adaptive algorithm can be one of the following algorithm or the combination thereof: least mean square (LMS) algorithm, recursive least square (RLS) algorithm, and least square (LS) algorithm.

Figure 7A:
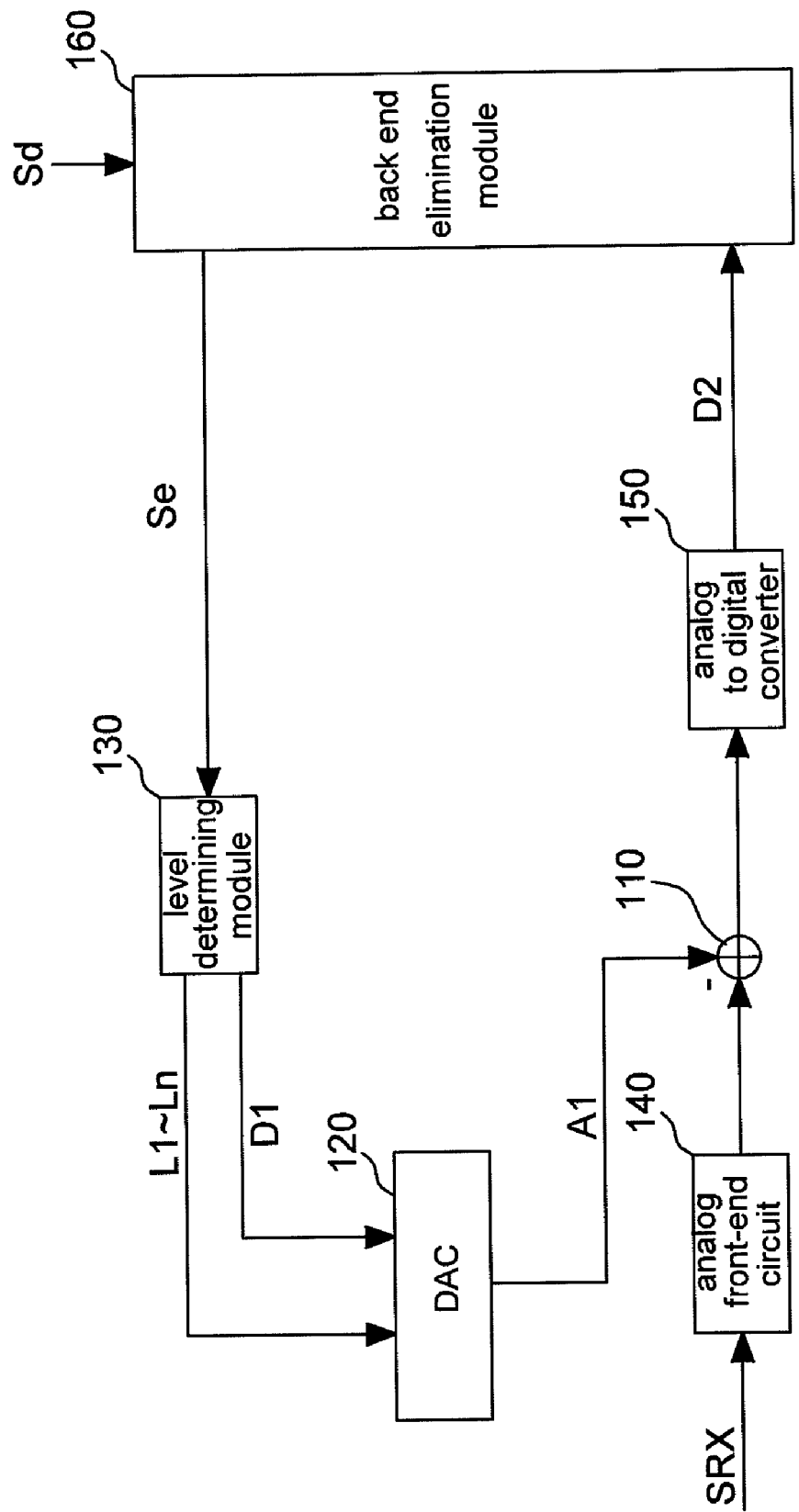
FIG. 7A shows a schematic diagram illustrating a communication device according to another embodiment of the invention.
Figure 7B:
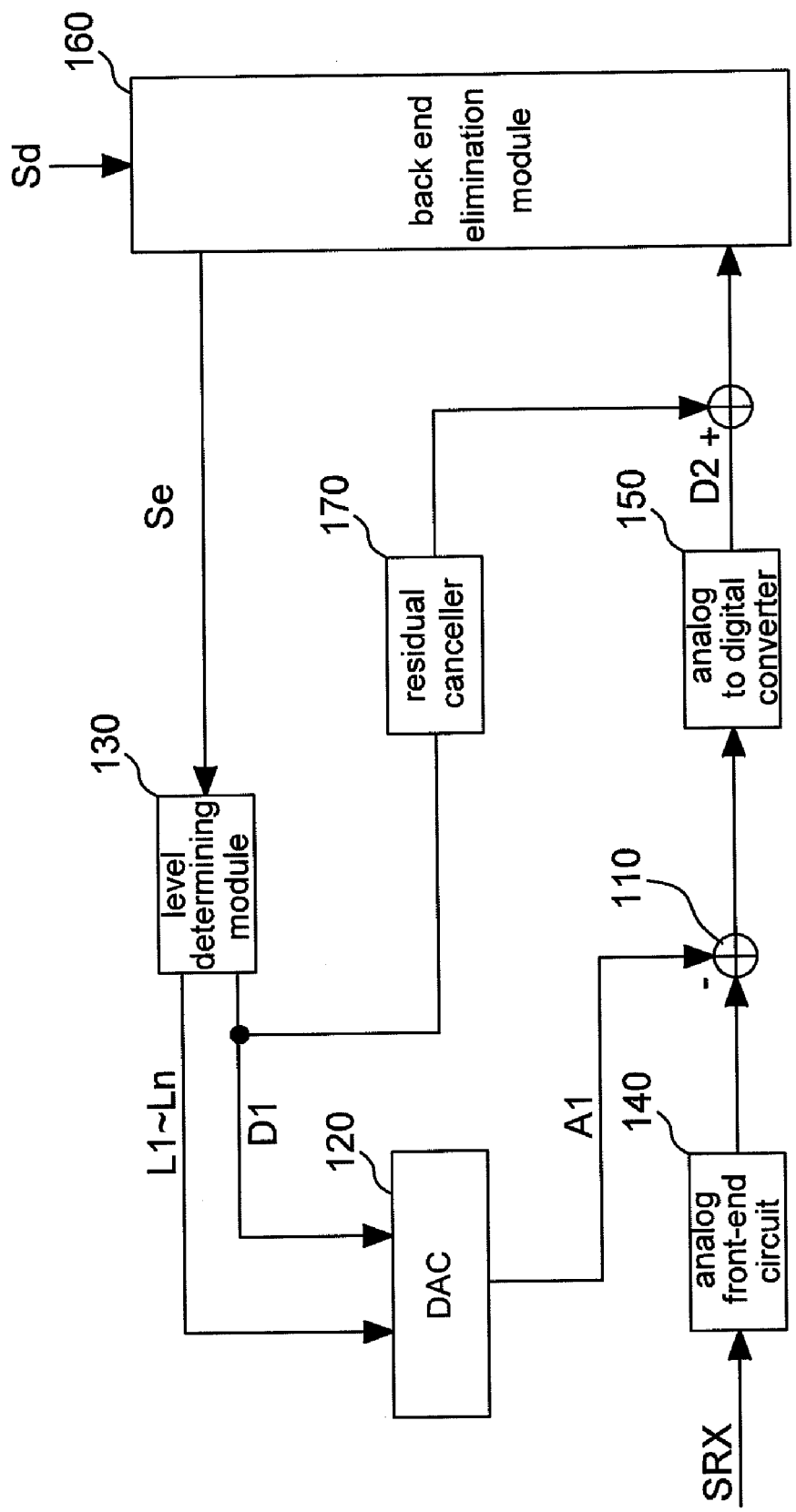
FIG. 7B shows a schematic diagram illustrating a communication device according to another embodiment of the invention.

Furthermore, in the communication device 100, the calculator 110 only needs to be provided before the analog to digital converter (ADC) 150 but not limited to be provided before the analog front-end circuit 140. Therefore, the allocation of the calculator 110 can be for example shown in FIGS. 7A and 7B. It should be noted that according to the allocation shown in FIG. 7A the back end elimination module 160 calculates an output interference response that is the same as the input interference response of the analog to digital converter (ADC) 150 according to the pulse-shaped analog signal A1 and also generates the estimating signal Se according to the output interference response and the second digital signal D2.

Figure 8A:
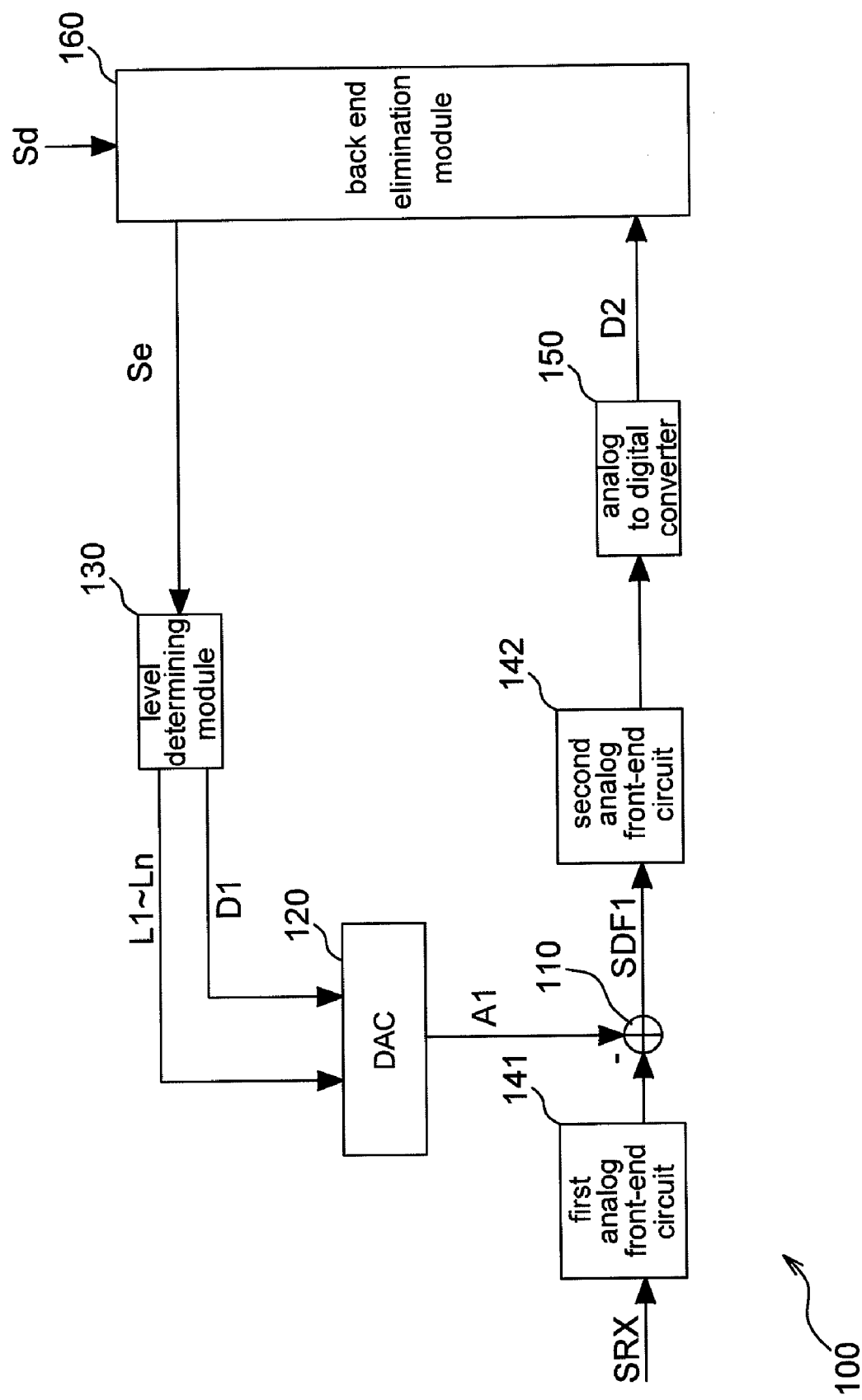
FIG. 8A shows a schematic diagram illustrating a communication device according to another embodiment of the invention.
Figure 8B:
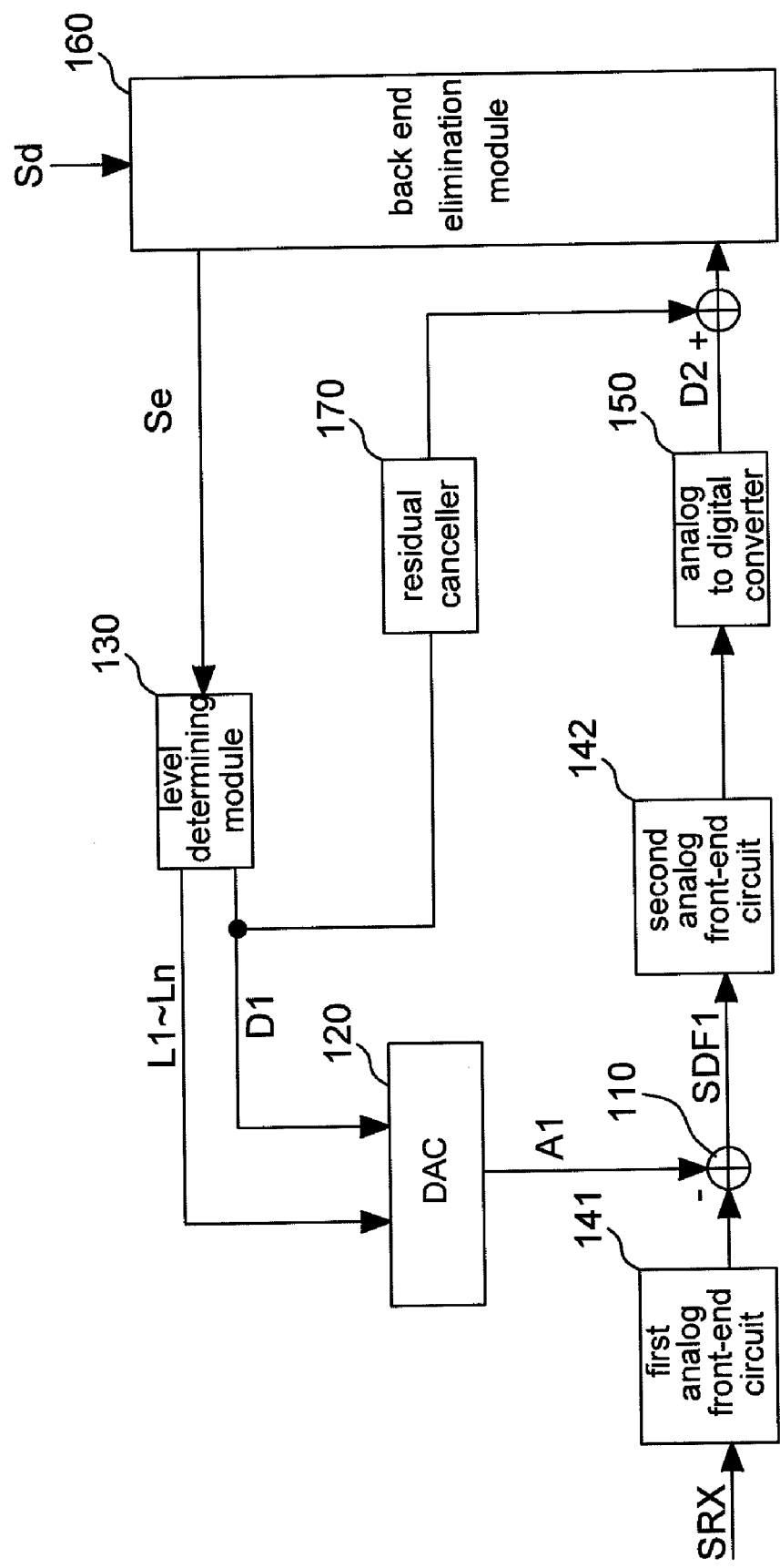
FIG. 8B shows a schematic diagram illustrating a communication device according to another embodiment of the invention.

Besides, generally the analog front-end circuit 140 can comprise a plurality of devices and the calculator 110 can be provided among these devices. As shown in FIGS. 8A and 8B, the calculator 110 is provided between the first analog front-end circuit 141 and the second analog front-end circuit 142.

In conclusion, the communication device according to the embodiments of the invention utilizes the digital to analog (DA) converter to generate a pulse-shaped analog signal to have the output interference response of the analog to digital (AD) converter be the same as the input interference response of the analog front-end circuit. Thus, the back end circuit can acquire the complete channel information of the original receiving signal in the digital domain so that the difference between the output interference response of the analog to digital (AD) converter and the input interference response of the analog front-end circuit can be eliminated and thus the echo and crosstalk components can be correctly eliminated. Concurrently, the purpose of reducing the dynamic range of the analog to digital (AD) converter as well as improving the design complexity can be achieved.

Although the present invention has been fully described by the above embodiments, the embodiments should not constitute the limitation of the scope of the invention. Various modifications or changes can be made by those who are skilled in the art without deviating from the spirit of the invention.

What is claimed is:

1. A communication device, comprising:
   a level determining module, for receiving an estimating signal and determining a plurality of voltage levels and voltage intensity thereof according to the estimating signal to generate a first digital signal;
   a digital to analog (DA) converter, for receiving the first digital signal and converting the first digital signal into a pulse-shaped analog signal according to the plurality of voltage levels and voltage intensity thereof; and
   an analog to digital (AD) converter, for receiving a first difference signal that is the result of subtracting the pulse-shaped analog signal from a receiving signal and converting the first difference signal into a second digital signal;
   wherein the pulse duration of the pulse-shaped analog signal is shorter than one sampling period of the analog to digital (AD) converter.

2. The communication device according to claim 1, wherein the pulse of the digital to analog (DA) converter and the sampling clock of the analog to digital (AD) converter are to be calibrated based on the principle of having the pulse duration of the pulse-shaped analog signal be shorter than one sampling period of the analog to digital (AD) converter, while the communication device is turned on or after the communication device executes for a predetermined period of time.

3. The communication device according to claim 1, wherein the analog to digital (AD) converter samples the maximum amplitude of the pulse at each time point.

4. The communication device according to claim 1, wherein the analog to digital (AD) converter has a conditional sampling equation on the pulse-shaped analog signal: $G(Pu, AFE)<1T$, where G represents convolution, Pu represents the pulse, AFE represents input interference response before the analog to digital (AD) converter, and 1T represents one time sampling duration.

5. The communication device according to claim 1, further comprising:
   a back end elimination module, for receiving the second digital signal and generating the estimating signal according to a desired signal and the second digital signal.

6. The communication device according to claim 1, further comprising:
   a residual canceller, for generating a response signal according to the first digital signal and compensating the second digital signal with the response signal.

7. A communication device, comprising:
   a level determining module, for receiving an estimating signal and determining a plurality of voltage levels and voltage intensity thereof according to the estimating signal to generate a first digital signal;

a digital to analog (DA) converter, for receiving the first digital signal and converting the first digital signal into a pulse-shaped analog signal according to the plurality of voltage levels and voltage intensity thereof;

an analog to digital (AD) converter, for receiving a first difference signal that is the result of subtracting the pulse-shaped analog signal from a receiving signal and converting the first difference signal into a second digital signal; and a back end elimination module, for generating the estimating signal according to an output interference response of the analog to digital (AD) converter and the second digital signal, wherein the output interference response is the same as an input interference response.

8. The communication device according to claim 7, wherein the input interference response is the input interference response of an analog front-end circuit and the analog front-end circuit is coupled to the analog to digital (AD) converter.

9. The communication device according to claim 7, wherein the pulse duration of the pulse-shaped analog signal is shorter than one sampling period of the analog to digital (AD) converter.

10. The communication device according to claim 7, wherein the analog to digital (AD) converter samples the maximum amplitude of the pulse at each time point.

11. The communication device according to claim 7, wherein the number of the voltage levels is an odd number or a power of two.

12. A noise cancellation method, comprising:

determining a plurality of voltage levels and voltage intensity thereof according to an estimating signal;

generating a first digital signal according to the plurality of voltage levels and the estimating signal;

converting the first digital signal into a pulse-shaped analog signal according to the plurality of voltage levels and voltage intensity thereof;

converting a difference signal into a second digital signal wherein the first difference signal is the result of subtracting the pulse-shaped analog signal from a receiving signal; and generating the estimating signal according to a output interference response of the analog to digital (AD) converter and the second digital signal, wherein the output interference response is the same as a input interference response.

13. The method according to claim 12, wherein the input interference response is the input interference response of an analog front-end circuit and the analog front-end circuit is coupled to the analog to digital (AD) converter.

14. The method according to claim 12, wherein the pulse duration of the pulse-shaped analog signal is shorter than one sampling period of the analog to digital (AD) converter.

15. The method according to claim 12, wherein the analog to digital (AD) converter samples the maximum amplitude of the pulse at each time point.

* * * * *